(12) United States Patent
Kikuchi

(10) Patent No.: US 8,305,123 B2
(45) Date of Patent: Nov. 6, 2012

(54) DUTY DETECTION CIRCUIT, DUTY CORRECTION CIRCUIT, AND DUTY DETECTION METHOD

(75) Inventor: Kazutaka Kikuchi, Kawasaki (JP)

(73) Assignee: Renesas Electronics Corporation, Kanagawa (JP)

( * ) Notice: Subject to any disclaimer, the term of this patent is extended or adjusted under 35 U.S.C. 154(b) by 140 days.

(21) Appl. No.: 12/623,713

(22) Filed: Nov. 23, 2009

(65) Prior Publication Data
US 2010/0127733 A1 May 27, 2010

(30) Foreign Application Priority Data
Nov. 25, 2008 (JP) ................................. 2008-299326

(51) Int. Cl.
*H03K 3/017* (2006.01)
(52) U.S. Cl. ...................................................... 327/175
(58) Field of Classification Search .................... 327/175
See application file for complete search history.

(56) References Cited

U.S. PATENT DOCUMENTS

| | | | | |
|---|---|---|---|---|
| 3,582,665 A | * | 6/1971 | Prozeller | 327/77 |
| 6,411,145 B1 | * | 6/2002 | Kueng et al. | 327/175 |
| 6,643,790 B1 | * | 11/2003 | Yu et al. | 713/500 |
| 6,833,743 B2 | * | 12/2004 | Gu et al. | 327/175 |
| 7,145,375 B2 | * | 12/2006 | Han | 327/175 |
| 7,417,479 B2 | * | 8/2008 | Kitayama | 327/175 |
| 7,501,870 B2 | * | 3/2009 | Choi et al. | 327/175 |
| 7,579,890 B2 | * | 8/2009 | Sohn | 327/175 |

FOREIGN PATENT DOCUMENTS

| | | |
|---|---|---|
| JP | 2006-303553 A | 11/2006 |
| JP | 2007-121114 A | 5/2007 |

* cited by examiner

*Primary Examiner* — Hai L Nguyen
(74) *Attorney, Agent, or Firm* — Sughrue Mion, PLLC

(57) ABSTRACT

Provided is a duty detection circuit including: a first capacitor; a first transistor that controls charge or discharge currents of the first capacitor during a first period of a clock signal; a second capacitor; a second transistor that controls charge or discharge currents of the second capacitor during a second period of the clock signal; and a latch circuit that detects that a potential of one of the first capacitor and the second capacitor reaches a predetermined potential, and latches an output based on a result of the detection.

9 Claims, 4 Drawing Sheets

DUTY DETECTION CIRCUIT, DUTY CORRECTION CIRCUIT, AND DUTY DETECTION METHOD

BACKGROUND

1. Field of the Invention

The present invention relates to a duty detection circuit that detects deviation in clock duty, a duty correction circuit incorporating the duty detection circuit, and a duty detection method.

2. Description of Related Art

In recent years, along with the speeding-up and reduction in voltage of application specific integrated circuits (ASICs), microprocessors, and the like, interfaces such as memories have increased in speed. In particular, when data is retrieved using both the rising and falling edges of a clock signal as in a double data rate (DDR) system, deviation in duty of clock signals fed into a circuit can be a major cause of the deterioration in setup/hold characteristics.

With the recent speeding-up of ASICs, microprocessors, and the like, the deviation in duty with respect to a clock cycle cannot be neglected. For this reason, a circuit for detecting and correcting a clock duty is often incorporated into delay locked loop (DLL) circuits, phase locked loop (PLL) circuits, input first-stage circuits, and the like.

FIG. 7 shows a duty detection circuit disclosed in Japanese Unexamined Patent Application Publication No. 2007-121114, and FIG. 8 shows a timing diagram of the operation of the duty detection circuit. The duty detection circuit shown in FIG. 7 includes a current source 27, MOS transistors 25 and 26 for inputting clocks to be compared, load MOS transistors 23 and 24, and precharge MOS transistors 20, 21, and 22. The duty detection circuit further includes an input control circuit 28 including logic circuits 29 and 30, an input control circuit 31, and a comparator 32 for comparing outputs.

Referring now to FIGS. 7 and 8, the operation of the duty detection circuit disclosed in Japanese Unexamined Patent Application Publication No. 2007-121114 will be described. Prior to duty detection, the precharge MOS transistors 20, 21, and 22 charge outputs DUTY_HB and DUTY_LB to a power supply potential. Signals LDCSMT/LDCSMB are activated to start the detection. During a time period when a clock LCLKOET is at high level, the MOS transistor 25 is turned on and electric charge of the charged output DUTY_LB is extracted, thereby decreasing the potential. During a time period when an inverted clock LCLKOEB is at high level, the MOS transistor 26 is turned on and electric charge of the charged output DUTY_HB is extracted, thereby decreasing the potential.

During a time period when the clock signals LCLKOET/LCLKOEB are at low level, the MOS transistors 25 and 26 are turned off and the potentials of the outputs DUTY_HB and DUTY_LB are maintained. The potentials of the outputs DUTY_HB and DUTY_LB are decreased in proportion to the period for which the clock is at high level. As shown in FIG. 8, for example, after inputting two cycles of the clock, the potentials of the outputs DUTY_HB and DUTY_LB obtained at the time are compared to determine a potential difference. A determination signal LDCT is then output.

When the clock duties are equal, the potentials of the outputs DUTY_HB and DUTY_LB are also equal to each other. Consideration is given to the case where there is duty deviation and the duty is 40% (40% high level period in a cycle period), for example. In this case, the ON period of the MOS transistor 26 on the inverted clock LCLKOEB side becomes longer, and the potential of the output DUTY_HB is further decreased.

In the case of the duty of 60%, in contrast, the ON period of the MOS transistor 25 on the clock LCLKOET side becomes longer, and the potential of the output DUTY_LB is further decreased. The charged potential is extracted during the period proportional to the duty, to thereby produce and hold a potential difference. Then, the comparator compares the potential difference and detects deviation in duty.

Japanese Unexamined Patent Application Publication No. 2006-303553 discloses a duty detection circuit that repeats charging and discharging of a plurality of capacitors based on a clock signal, and detects a potential difference between the capacitors, thereby detecting the duty of the clock signal.

SUMMARY

The present inventors have found the following problem. The circuits disclosed in Japanese Unexamined Patent Application Publication Nos. 2007-121114 and 2006-303553 have a configuration in which a duty deviation is converted into a potential difference and the potential difference is held and determined by a comparator. Accordingly, in the technique disclosed in Japanese Unexamined Patent Application Publication No. 2007-121114, for example, the closer the clock duty approaches 50%, the smaller the potential difference between the outputs DUTY_HB and DUTY_LB that change per clock becomes. Therefore, in this case, even when the clock signal is input several times, the potential difference between the outputs DUTY_HB and DUTY_LB is not increased to a value large enough to be determined by a comparator.

A potential difference due to a duty deviation in the circuit disclosed in Japanese Unexamined Patent Application Publication No. 2007-121114 can be obtained in the following manner.

First, based on the equation CV=IT, a decreased amount of potential of each of the outputs DUTY_HB and DUTY_LB for each "H" (H level) pulse of the clock LCLKOET or LCLKOEB can be expressed as follows. In this case, C represents a capacitance; V, a potential; I, a current; and T, a time (pulse width, duty deviation time).

$$-I/C*T(\text{H pulse width}) \quad (1)$$

A potential difference due to a duty deviation amount can be expressed as follows.

$$I/C*T(\text{duty deviation time})*N \quad (2)$$

This potential difference should fall within the operating range of the comparator. Accordingly, assuming that the upper limit of a comparator operating voltage is represented by Vmax and the lower limit of the comparator operating voltage is represented by Vmin, the following equation (3) is obtained based on the equation (1).

$$V\text{max} > VDD - I/C*T(L \text{ pulse width})*N > V\text{min} \quad (3)$$

Further, assuming that a potential difference that can be determined by the comparator is represented by $V\alpha$, the following equation (4) is obtained.

$$V\alpha < I/C*T(\text{duty deviation time})*N \quad (4)$$

The maximum accuracy obtained at this time is expressed as follows.

$$t/T < V\alpha/(VDD - V\text{max}) \quad (5)$$

Assuming that t=5 psec, T=400 psec, VDD=1.0 V, and Vmax=0.7 V, about Vα=4 mV needs to be detected, which is not practical in view of power supply noise, process variations, or the like.

Further, if the time T varies, it is difficult to satisfy the equation (3) because N is constant. If the number of clock inputs is increased so as to increase the potential difference between the outputs DUTY_HB and DUTY_LB, it is difficult to set the potentials of the outputs DUTY_HB and DUTY_LB within the operating voltage range of the comparator. Particularly when the frequency range of a product is large, it is difficult to carry out duty detection.

As described above, the present inventors have found a problem that when a duty difference of clocks is small, it is difficult to detect a duty deviation with accuracy.

A first exemplary aspect of the present invention is a duty detection circuit including: a first capacitor; a first transistor that controls charge or discharge currents of the first capacitor during a first period of a clock signal; a second capacitor; a second transistor that controls charge or discharge currents of the second capacitor during a second period of the clock signal; and a latch circuit that detects that a potential of one of the first capacitor and the second capacitor reaches a predetermined potential, and latches an output based on a result of the detection. With this configuration, a duty can be detected when the potential of one of the capacitors reaches the predetermined potential. Accordingly, deviation in duty can be detected with high accuracy even when a duty difference of clocks is small.

A second exemplary aspect of the present invention is a duty correction circuit including: a duty detection circuit according to the first exemplary aspect of the present invention; a duty adjustment signal generating circuit that is connected to the duty detection circuit, and generates a duty adjustment signal based on a detection result from the duty detection circuit; and a duty adjustment circuit that is connected to the duty adjustment signal generating circuit, and adjusts a duty of a clock signal based on the duty adjustment signal. With this configuration, a duty can be detected when the potential of one of the capacitors reaches the predetermined potential. Accordingly, it is possible to provide a duty correction circuit capable of detecting deviation in duty with high accuracy even when a duty difference of clocks is small.

A third exemplary aspect of the present invention is a duty detection method including: charging or discharging a first capacitor during a first period of a clock signal; charging or discharging a second capacitor during a second period of the clock signal; alternately repeating the charging or discharging of the first capacitor and the charging or discharging of the second capacitor, detecting that a potential of one of the first capacitor and the second capacitor reaches a predetermined potential, and latching a result of the detection. In the duty detection method according to the third exemplary aspect of the invention, a duty can be detected when the potential of one of the capacitors reaches the predetermined potential. Accordingly, it is possible to detect deviation in duty with high accuracy even when a duty difference of clocks is small.

According to exemplary aspects of the present invention, it is possible to provide a duty detection circuit and a duty detection method that are capable of detecting deviation in duty with high accuracy even when a duty difference of clocks is small.

BRIEF DESCRIPTION OF THE DRAWINGS

The above and other exemplary aspects, advantages and features will be more apparent from the following description of certain exemplary embodiments taken in conjunction with the accompanying drawings, in which.

DETAILED DESCRIPTION OF THE EXEMPLARY EMBODIMENTS

[First Exemplary Embodiment]

Exemplary embodiments of the present invention will be described below with reference to the accompanying drawings.

Figure 1:
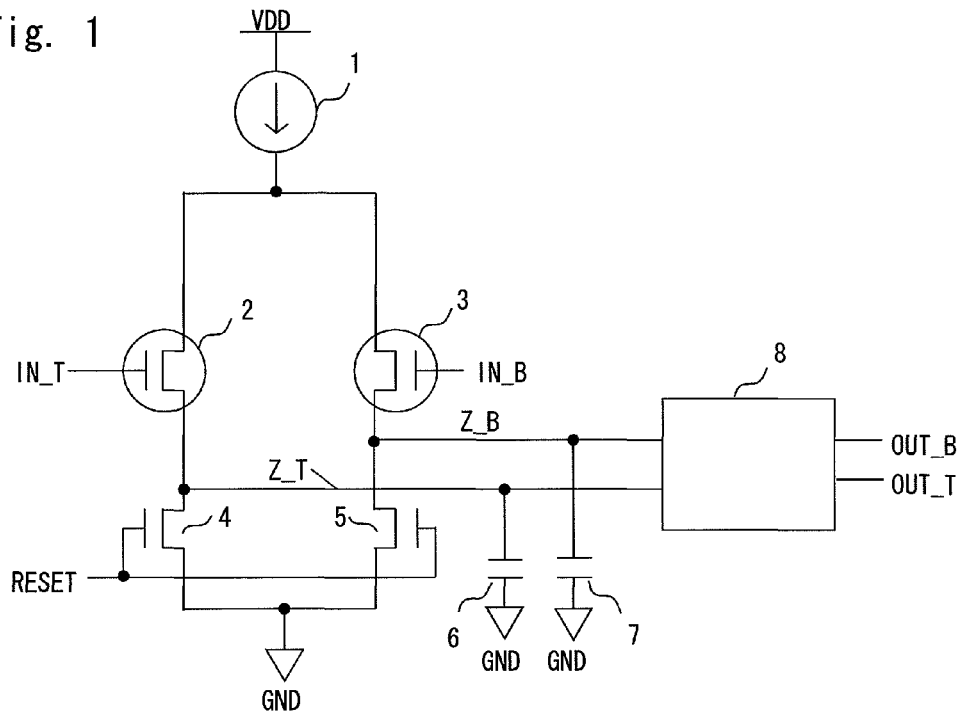
FIG. 1 is a diagram illustrating a duty detection circuit according to a first exemplary embodiment of the present invention.

Reference is now made to FIG. 1 showing a circuit diagram of a duty detection circuit according to a first exemplary embodiment of the present invention. The duty detection circuit of this exemplary embodiment includes a first capacitor 6 and a first transistor 2 which connects the first capacitor 6 and a constant current source 1 to each other during a first period of a clock signal. The first transistor 2 controls charge or discharge currents of the first capacitor 6.

The duty detection circuit of this exemplary embodiment further includes a second capacitor 7 and a second transistor 3 which connects the second capacitor 7 and the constant current source 1 to each other during a second period of the clock signal. The second transistor 3 controls charge or discharge currents of the second capacitor 7.

The duty detection circuit of this exemplary embodiment further includes a latch circuit 8 which detects that a potential of one of the first capacitor and the second capacitor reaches a predetermined potential, and latches an output based on a detection result.

The transistors 2 and 3 are, for example, PMOS transistors. The transistor 2 receives a clock IN_T, and the transistor 3 receives a clock IN_B. One end of the capacitor 6 is connected to GND, and the other end of the capacitor 6 is connected to each of the transistor 2 and the latch circuit 8. The potential of the capacitor 6 on the side connected to each of the transistor 2 and the latch circuit 8 is represented by Z_T. One end of the capacitor 7 is connected to the GND, and the other end of the capacitor 7 is connected to each of the transistor 3 and the latch circuit 8. The potential of the capacitor 7 on the side connected to each of the transistor 3 and the latch circuit 8 is represented by Z_B.

The latch circuit 8 detects that the potentials Z_T and Z_B (duty comparison potentials) reach a predetermined potential, and latches detection results as OUT_B and OUT_T.

The duty detection circuit of this exemplary embodiment may include a reset circuit that resets the potentials of the first capacitor 6 and the second capacitor 7. In this case, the reset circuit is composed of, for example, an NMOS transistor 4 which connects the first capacitor 6 and the GND to each other, and an NMOS transistor 5 which connects the capacitor 7 and the GND to each other. The reset circuit applies a reset potential to the gates of the transistors 4 and 5 so that the potentials of the capacitors 6 and 7 can be set to the GND.

Next, the operation of the duty detection circuit according to this exemplary embodiment will be described.

Prior to duty detection, the potentials of the capacitors 6 and 7 are first set to the GND. For example, in the duty detection circuit of this exemplary embodiment, the potential of a signal RESET applied to the gates of the transistors 4 and 5 is set to "H" (H level), thereby making it possible to set the potentials of the capacitors 6 and 7, i.e., the potentials Z_T and Z_B to the GND.

Then, the potential of the RESET is set to "L" (L level) to turn off the transistors 4 and 5. At this timing, the clocks IN_T and IN_B start to be supplied to the transistors 2 and 3, respectively. When the clock IN_T is at "L" level, i.e., during a period A (first period) of the clock shown in FIG. 4, the transistor 2 is turned on and the capacitor 6 (potential Z_T) is charged with an electric charge corresponding to an "L" pulse width of the clock IN_T (a time duration of the period A).

Figure 4:
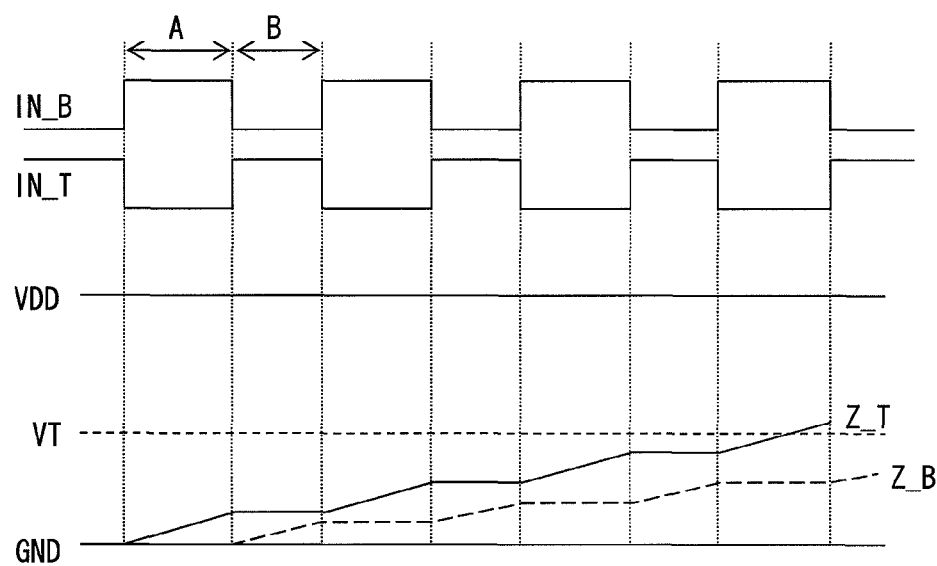
FIG. 4 is a diagram illustrating operation of the duty detection circuit according to the first exemplary embodiment.

During the period A of the clock shown in FIG. 4, the clock IN_B is at "H" level, and thus the transistor 3 is turned off. Accordingly, the capacitor 7 is not charged at this time.

Herein, the clock IN_B is an inverted signal of the clock IN_T. The clock IN_T is inverted by an inverting circuit, for example, thereby enabling generation of the clock IN_B.

During a half cycle after the period A, i.e., during a period B (second period) of the clock shown in FIG. 4, the clock IN_B is at "L" level and the transistor 3 is turned on. In this case, the capacitor 7 (potential Z_B) is charged with an electric charge corresponding to an "L" pulse width of the clock IN_B. During the period B of the clock shown in FIG. 4, the clock IN_T is at "H" level, and thus the transistor 2 is turned off. Accordingly, the capacitor 6 is not charged at this time.

By repeating these operations, the potential Z_T of the capacitor 6 and the potential Z_B of the capacitor 7 are gradually increased. The latch circuit 8 receives the potentials Z_T and Z_B, and detects which one of the potentials Z_T and Z_B reaches a predetermined potential (VT). Then, the latch circuit 8 latches the detection results as OUT_B and OUT_T. Since the OUT_B and OUT_T are latched by the latch circuit, data is kept stored unless it is reset.

In the case of FIG. 4, the period in which the transistor 2, which contributes to a rise of the potential Z_T, is turned on (a width of the period A in FIG. 4) is longer than the period in which the transistor 3, which contributes to a rise of the potential Z_B, is turned on (a width of the period B in FIG. 4). In this case, the potential Z_T of the capacitor 6 reaches the predetermined potential (VT) earlier than the potential Z_B of the capacitor 7.

In this manner, the latch circuit 8 detects which one of the potentials Z_T and Z_B reaches the predetermined potential (VT) earlier, thereby making it possible to detect clock deviation. At the same time, duty detection can be performed without controlling the number of clock inputs.

Figure 2:
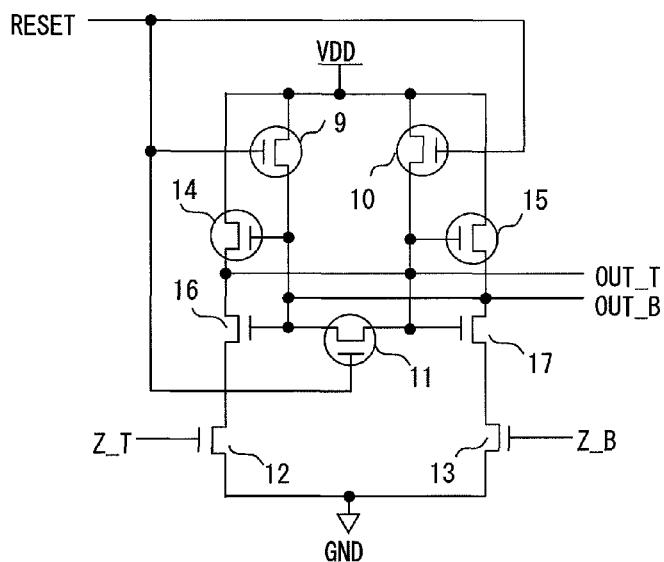
FIG. 2 is a diagram illustrating an exemplary latch circuit of the duty detection circuit according to the first exemplary embodiment.

Note that an exemplary circuit shown in FIG. 2 can be used as the latch circuit 8 of the duty detection circuit of this exemplary embodiment.

The circuit shown in FIG. 2 includes precharge PMOS transistors 9, 10, and 11, and NMOS transistors 12 and 13 the gates of which receive the potentials Z_T and Z_B, respectively. The circuit shown in FIG. 2 further includes NMOS transistors 16 and 17 whose sources are connected to the NMOS transistors 12 and 13, respectively, and an inverter latch circuit composed of PMOS transistors 14 and 15. The gates of the PMOS transistors 9, 10, and 11 are each connected to the RESET.

Next, the operation of the circuit shown in FIG. 2 will be described. The potential of the RESET is first set to "L" level, and the potentials of the OUT_T and OUT_B are set to VDD. Then, the potential of the RESET is set to "H" level, and the PMOS transistors 9, 10, and 11 are turned off. At this time, since the potentials of the OUT_T and OUT_B are set to the VDD, the NMOS transistors 16 and 17 are turned on, and the PMOS transistors 14 and 15 are turned off.

When the potential Z_T reaches a threshold voltage (VT: predetermined potential) of the NMOS transistor 12 earlier than the potential Z_B, the NMOS transistor 12 is turned on. The NMOS transistor 16, which connects the OUT_T and the NMOS transistor 12 to each other, is also turned on, with the result that the OUT_T is set to "L" level.

In this case, the PMOS transistor 15 is turned on, and the NMOS transistor 17 is turned off. Accordingly, the OUT_T becomes "L" level and the OUT_B becomes "H" level regardless of the potential of the Z_B, and this state is fixed.

Likewise, when the potential Z_B reaches the threshold voltage (VT: predetermined potential) of the NMOS transistor 13 earlier than the potential Z_T, the NMOS transistor 13 is turned on. At this time, the NMOS transistor 17, which connects the OUT_B and the NMOS transistor 13 to each other, is also turned on, with the result that the OUT_B becomes "L" level.

In this case, the PMOS transistor 14 is turned on, and the NMOS transistor 16 is turned off. Accordingly, the OUT_B becomes "L" level and the OUT_T becomes "H" level regardless of the potential of the Z_T, and this state is fixed.

In the circuit shown in FIG. 2, the results OUT_B and OUT_T are held unless the RESET becomes "L" level.

Figure 3:
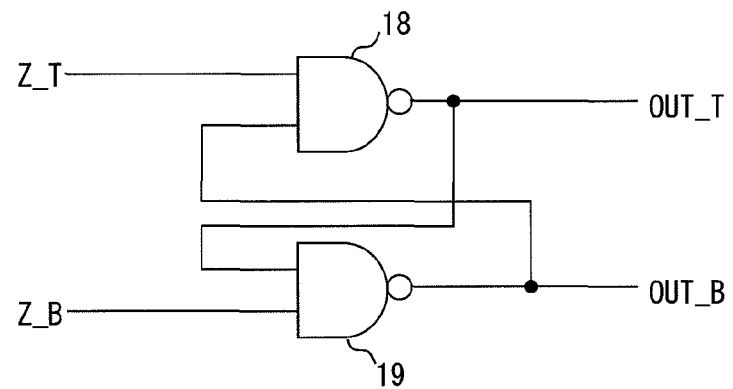
FIG. 3 is a diagram illustrating another exemplary latch circuit of the duty detection circuit according to the first exemplary embodiment.

An exemplary circuit shown in FIG. 3 can also be used as the latch circuit 8 of the duty detection circuit according to this exemplary embodiment. The circuit shown in FIG. 3 is an SR latch circuit including NAND circuits 18 and 19 which are connected crosswise. In the circuit shown in FIG. 3, the potential Z_T is input to the NAND circuit 18, and the potential Z_B is input to the NAND circuit 19. The OUT_T is output from the NAND circuit 18, and the OUT_B is output from the NAND circuit 19.

Figure 7:
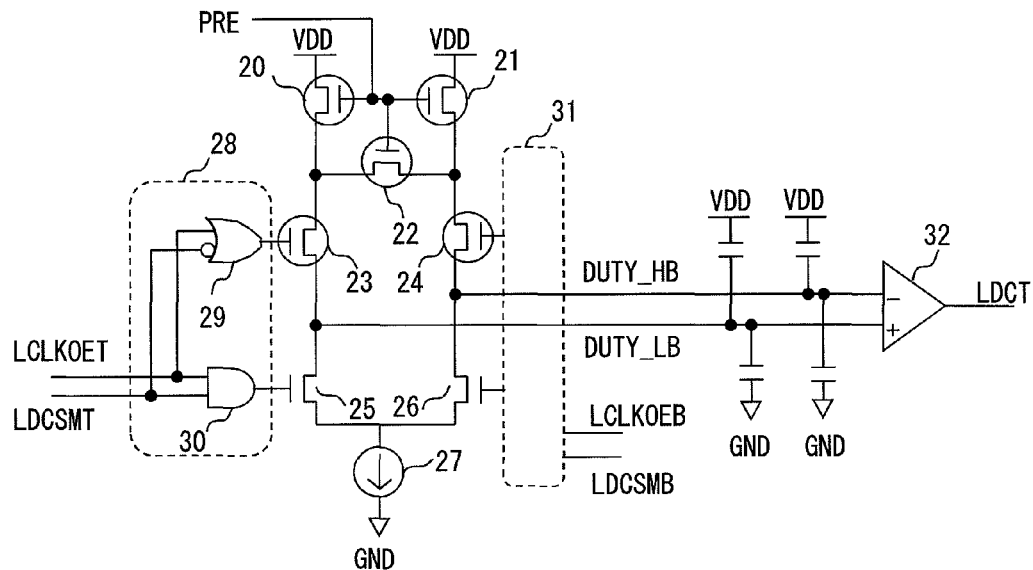
FIG. 7 is a diagram showing a duty detection circuit disclosed in Japanese Unexamined Patent Application Publication No. 2007-121114.
Figure 8:
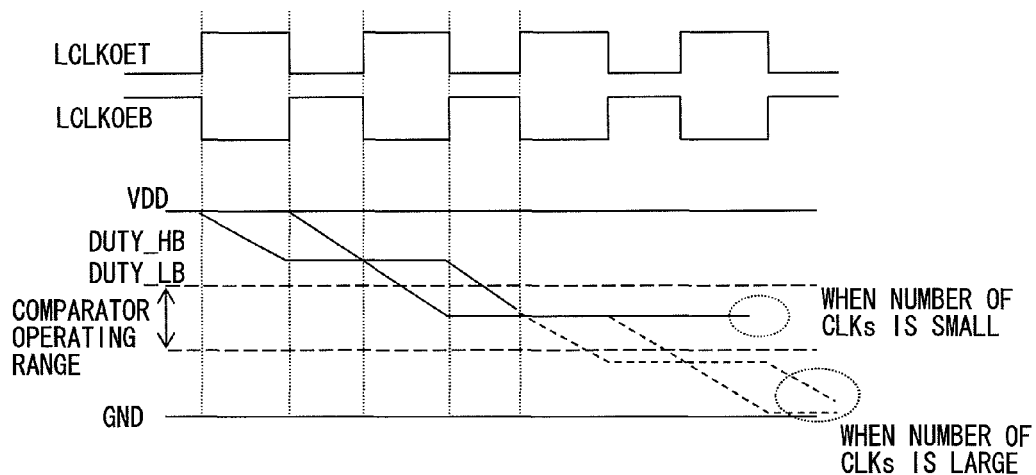
FIG. 8 is a diagram showing operation of the duty detection circuit disclosed in Japanese Unexamined Patent Application Publication No. 2007-121114.

In the duty detection circuit disclosed in Japanese Unexamined Patent Application Publication No. 2007-121114 (see FIGS. 7 and 8), the comparator 32 obtains a potential difference (potential difference between DUTY_HB and DUTY_LB) for use in duty detection. Accordingly, the potential difference needs to be increased beyond the determination capability of the comparator, which imposes limitations on the accuracy of the duty detection circuit. Further, in this system, the number of clocks is defined to produce a potential difference.

Meanwhile, in the duty detection circuit according to this exemplary embodiment, the latch circuit 8 detects which one of the duty comparison potentials (Z_T and Z_B) reaches the predetermined potential (VT) earlier and latches a detection result, thereby detecting deviation in duty. Therefore, the duty detection can be carried out at the time when the duty comparison potential reaches the predetermined potential (VT).

In the duty detection circuit according to this exemplary embodiment, the number of clocks (number of pulse inputs) is not limited, unlike the system disclosed in Japanese Unexamined Patent Application Publication No. 2007-121114.

Accordingly, the case where a pulse is input earlier is favorable for the determination. In this regard, however, the capacities of the capacitors 6 and 7 and the constant current amount of the constant current source 1 are adjusted so that (a potential difference due to a duty deviation amount*the number of input pulses) becomes larger than an increased amount of the potential Z_T or Z_B for each "L" pulse of the clock IN_T or clock IN_B. This enables accurate determination.

That is, based on the equation CV=IT, the increased amount of each of the potentials Z_T and Z_B for each "L" pulse of the clock IN_T or clock IN_B can be expressed as follows. In this case, C represents a capacitance; V, a potential; I, a current; and T, a time (pulse width, duty deviation time)

$$I/C*T(L\ pulse\ width) \quad (6)$$

A potential difference due to a duty deviation amount can be expressed as follows.

$$I/C*T(duty\ deviation\ time)*N \quad (7)$$

Here, based on the equations (6) and (7), the following equation (8) is obtained.

$$I/C*T(L\ pulse\ width) < I/C*T(duty\ deviation\ time)*N \quad (8)$$

The relation between the predetermined potential (VT) and the increased amount of the potential for each "L" pulse of the clock IN_T or IN_B is expressed as follows.

$$VT > I/C*T(L\ pulse\ width)*N \quad (9)$$

The following equation (10) can be derived from these equations.

$$I/C < (duty\ deviation\ time)/(square\ of\ pulse\ width)*VT \quad (10)$$

Accordingly, the capacitance value (C) of the capacitor is increased or the current I of the constant current source is decreased based on the equation (10), thereby improving the accuracy of the duty detection circuit according to this exemplary embodiment. For example, when a clock of 400 psec is detected with an accuracy of 5 psec, C=8 pF (when VT=0.5 V, I=1 μA) is satisfied.

Next, a duty detection method according to this exemplary embodiment will be described. The duty detection method of this exemplary embodiment includes the following steps:

a first step of charging or discharging the first capacitor during the first period of a clock signal;

a second step of charging or discharging the second capacitor during the second period of the clock signal; and a third step of alternately repeating the first step and the second step, detecting that the potential of one of the first capacitor and the second capacitor reaches the predetermined potential, and latching a result of the detection.

The duty detection method of this exemplary embodiment may further include a reset step of resetting the potentials of the first and second capacitors, prior to the first and second steps.

In this exemplary embodiment, even if the PMOS transistors are replaced with the NMOS transistors, the same operation can be obtained. As illustrated in FIG. 1, the PMOS transistors 2 and 3 receive the clocks IN_T and the clock IN_B, respectively, and each of the NMOS transistors 4 and 5 receives the reset signal. Alternatively, each of the PMOS transistors 2 and 3 may receive the reset signal and the NMOS transistors 4 and 5 may receive the clocks IN_T and IN_B, respectively, for example.

At this time, the constant current source 1 is connected between the sources of the NMOS transistors 4 and 5 and the GND, and the sources of the PMOS transistors 2 and 3 are each connected to the VDD. In this case, the first and second capacitors are charged to the VDD in response to the reset signal. Then, the NMOS transistors 4 and 5 receive the clock signals IN_T and IN_B, respectively, thereby discharging the first and second capacitors. Specifically, the first capacitor is discharged during the first period, and the second capacitor is discharged during the second period. The logic of the reset signal is opposite to that of the clocks IN_T and IN_B.

According to the duty detection circuit and duty detection method of this exemplary embodiment as described above, it is possible to provide a duty detection circuit and a duty detection method that are capable of detecting deviation in duty with high accuracy even when a duty difference of clocks is small. Moreover, in the duty detection circuit and duty detection method of this exemplary embodiment, the accuracy of detecting a duty can be further improved by adjusting a value of a capacitance constituting a circuit or a value of a constant current source.

[Second Exemplary Embodiment]

Next, a second exemplary embodiment of the present invention will be described below.

Figure 5:
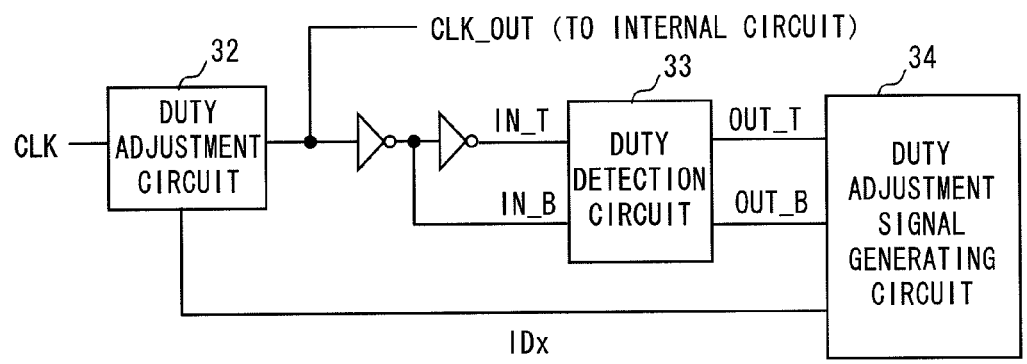
FIG. 5 is a diagram illustrating a duty correction circuit according to a second exemplary embodiment of the present invention.

In the second exemplary embodiment, a duty correction circuit incorporating the duty detection circuit described in the first exemplary embodiment will be described with reference to FIG. 5. FIG. 5 is a block diagram showing a duty correction circuit that corrects a duty of a clock (CLK) generated from a DLL, a PLL, an input first-stage circuit, or the like.

As shown in FIG. 5, the duty correction circuit of this exemplary embodiment includes a duty detection circuit 33 having a configuration described in the first exemplary embodiment, and a duty adjustment signal generating circuit 34 that is connected to the duty detection circuit 33 and generates a duty adjustment signal based on a detection result from the duty detection circuit 33. The duty correction circuit of this exemplary embodiment further includes a duty adjustment circuit 32 that is connected to the duty adjustment signal generating circuit 34 and adjusts the duty of the clock signal based on a duty adjustment signal IDx.

The operation of the duty correction circuit will be described with reference to FIG. 5. The clock CLK generated from the DLL or the like passes through the duty adjustment circuit 32 which is in a default state. The clock obtained at this time is represented by CLK_OUT.

Then, a clock having the same phase as the cloak CLK_OUT and an inverted clock obtained by inverting the clock CLK_OUT using an inverter are input to the duty detection circuit 33. The duty detection circuit 33 detects a duty by the operation described in the first exemplary embodiment, and sends the duty detection results OUT_T and OUT_B to the duty adjustment signal generating circuit 34.

Upon receiving the determination results as OUT_T and OUT_B from the duty detection circuit 33, the duty adjustment signal generating circuit 34 generates the duty adjustment signal IDx so that the duty of the CLK_OUT approaches 50%, and sends the duty adjustment signal thus generated to the duty adjustment circuit 32.

An optimum value of each duty adjustment code IDx is obtained by repeating these operations many times, with the result that the duty of the CLK_OUT can be made closer to 50%.

Figure 6:
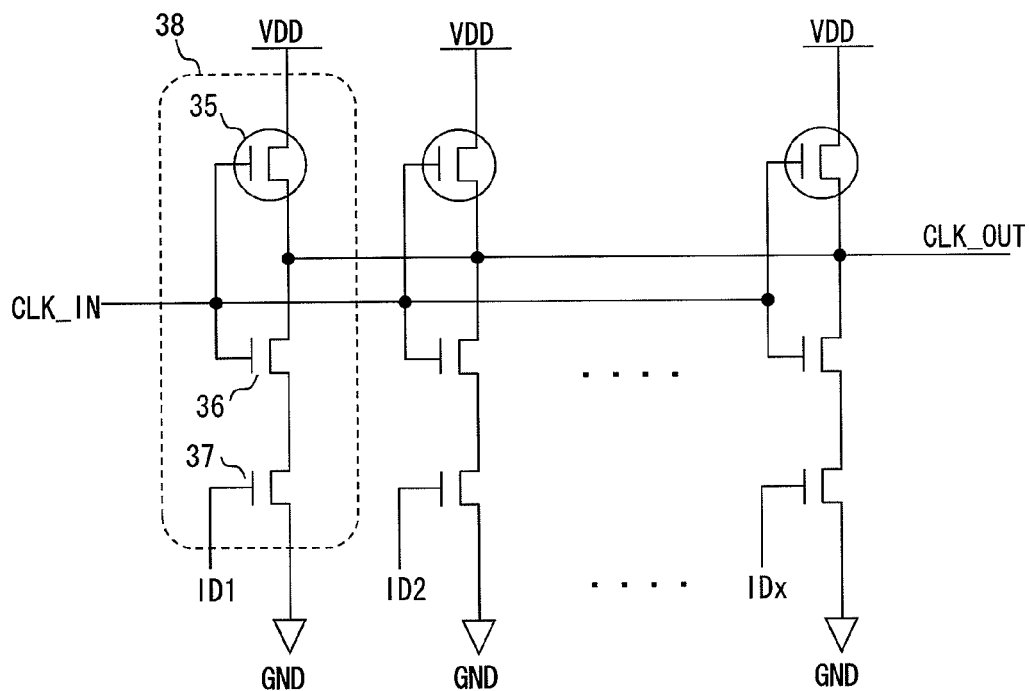
FIG. 6 is a diagram illustrating an exemplary duty adjustment circuit constituting the duty correction circuit according to the second exemplary embodiment.

Referring next to FIG. 6 illustrating an example of the duty adjustment circuit 32 shown in FIG. 5.

The duty adjustment circuit shown in FIG. 6 includes a PMOS transistor 35 and NMOS transistors 36 and 37. The gate of the PMOS transistor 35 and the gate of the NMOS transistor 36 are connected to the CLK_IN. The drain of the PMOS transistor 35 and the drain of the NMOS transistor 36 are connected to the CLK_OUT. The source of the NMOS transistor 36 is connected to the drain of the NMOS transistor 37. The source of the NMOS transistor 37 is connected to the GND. The circuit configured as described above is a unit of circuit (denoted by reference numeral 38 of FIG. 6) which constitutes the duty adjustment circuit.

The gate of the NMOS transistor 37 receives one of the duty adjustment codes IDx. There is provided a plurality of circuit units which have a configuration similar to that of the circuit unit 38 constituting the duty adjustment circuit and which have different duty adjustment codes IDx. The input and output of the circuit units are short-circuited.

Next, the operation of the duty adjustment circuit shown in FIG. 6 will be described. When the input CLK_IN changes from "H" to "L", the PMOS transistor 35 is turned on and the potential of the VDD is supplied to the CLK_OUT. As a result, the CLK_OUT becomes "H" level regardless of the duty adjustment code IDx.

When the input CLK_IN changes from "L" to "H" and the duty adjustment code IDx indicates "L", the NMOS transistor 37 is turned off. Accordingly, the CLK_OUT is maintained at "H" level.

Meanwhile, when the input CLK_IN changes from "L" to "H" and the duty adjustment code IDx indicates "H", the NMOS transistor 37 is turned on. Accordingly, the current capability is changed by extracting a current from the CLK_OUT. Thus, the time for reaching "L" level can be controlled by the duty adjustment codes IDx, and the duty can also be adjusted.

Specifically, when the duty adjustment is not performed, all the duty adjustment codes IDx to be input to the duty adjustment circuit are set to the "L" state. Meanwhile, when the duty adjustment is performed, some of the duty adjustment codes IDx are set to the "H" state and the others are set to the "L" state. That is, the adjustment of the number of the duty adjustment codes IDx set to the "H" state makes it possible to adjust the time required for the CLK_OUT to reach "L" level and to adjust the duty.

According to the duty correction circuit of this exemplary embodiment as described above, it is possible to provide a duty correction circuit capable of detecting deviation in duty with high accuracy even when a duty difference of clocks is small.

The first and second exemplary embodiments can be combined as desirable by one of ordinary skill in the art.

While the invention has been described in terms of several exemplary embodiments, those skilled in the art will recognize that the invention can be practiced with various modifications within the spirit and scope of the appended claims and the invention is not limited to the examples described above.

Further, the scope of the claims is not limited by the exemplary embodiments described above.

Furthermore, it is noted that, Applicant's intent is to encompass equivalents of all claim elements, even if amended later during prosecution.

What is claimed is:

1. A duty detection circuit comprising:
a first capacitor;
a first transistor that controls charge or discharge currents of the first capacitor during a first period of a clock signal;
a second capacitor;
a second transistor that controls charge or discharge currents of the second capacitor during a second period of the clock signal; and
a latch circuit configured to assert a first control signal when an electrical potential of the first node reaches a predetermined potential before an electrical potential of the second node reaches the predetermined potential and to assert a second control signal when the electrical potential of the second node reaches the predetermined potential before the electrical potential of the first node reaches the predetermined potential.

2. The duty detection circuit according to claim 1, further comprising a reset circuit that resets the potential of the first capacitor and the potential of the second capacitor.

3. The duty detection circuit according to claim 1, wherein each of the first transistor and the second transistor comprises a PMOS transistor.

4. The duty detection circuit according to claim 1, wherein the first transistor receives the clock signal, and the second transistor receives an inverted signal of the clock signal.

5. A duty detection method comprising:
charging or discharging a first capacitor during a first period of a clock signal;
charging or discharging a second capacitor during a second period of the clock signal;
alternately repeating the charging or discharging of the first capacitor and the charging or discharging of the second capacitor;
detecting that a potential of one of the first capacitor and the second capacitor reaches a predetermined potential before a potential of another of the first capacitor and the second capacitor reaches the predetermined potential; and
latching a result of the detection.

6. The duty detection method according to claim 5, wherein the first capacitor is charged during the first period, and the second capacitor is charged during the second period.

7. The duty detection method according to claim 5, wherein the first capacitor is discharged during the first period, and the second capacitor is discharged during the second period.

8. The duty detection method according to claim 5, wherein the potential of the first capacitor and the potential of the second capacitor are reset before the charging or discharging of the first capacitor and the second capacitor.

9. A circuit comprising:
a first capacitor coupled to a first node;
a first transistor coupled to the first node to charge the first capacitor during a first period of a clock signal;
a second capacitor coupled to a second node;
a second transistor coupled to the second node to charge the second capacitor during a second period of the clock signal;
a latch circuit coupled to a third node and a fourth node, the latch circuit configured to assert a first control signal on the third node when an electrical potential of the first node reaches a predetermined potential before an electrical potential of the second node reaches the predetermined potential and to assert a second control signal on the fourth node when the electrical potential of the second node reaches the predetermined potential before the electrical potential of the first node reaches the predetermined potential.

* * * * *